United States Patent [19]
Filip

[11] Patent Number: 6,081,572
[45] Date of Patent: Jun. 27, 2000

[54] LOCK-IN AID FREQUENCY DETECTOR

[75] Inventor: Jan Filip, Burgdorf, Germany

[73] Assignee: Maxim Integrated Products, Sunnyvale, Calif.

[21] Appl. No.: 09/141,673

[22] Filed: Aug. 27, 1998

[51] Int. Cl.[7] .............................. H03D 3/24; H03D 3/18; H03D 3/00; H03D 3/02; H03D 1/00
[52] U.S. Cl. ..................... 375/376; 375/375; 375/373; 375/327; 329/307; 329/325; 329/360; 327/147; 327/156; 370/516
[58] Field of Search ..................................... 375/375, 376, 375/373, 327; 329/307, 325, 360; 327/147, 156; 370/516

[56] References Cited

U.S. PATENT DOCUMENTS

| | | | |
|---|---|---|---|
| 4,267,514 | 5/1981 | Kimsey | 327/12 |
| 4,739,284 | 4/1988 | McGinn | 331/1 A |
| 4,773,085 | 9/1988 | Cordell | 375/375 |
| 4,965,528 | 10/1990 | Okanobu . | |
| 5,006,818 | 4/1991 | Koyama et al. . | |
| 5,079,515 | 1/1992 | Tanimoto . | |
| 5,172,397 | 12/1992 | Llewellyn | 375/359 |
| 5,592,125 | 1/1997 | Williams | 331/1 A |
| 5,610,954 | 3/1997 | Miyashita et al. | 375/375 |
| 5,694,088 | 12/1997 | Dickson | 331/12 |

OTHER PUBLICATIONS

Katsuji Kimura, "The Ultra–Multi–Tanh Technique for Bipolar Linear Transconductance Amplifiers", Apr. 1997, IEEE Transactions on Circuits and Systems–I Fundamental Theory and Applications, vol. 44, No. 4, pp. 288–302.

Barrie Gilbert, "The Multi–tanh Principle: A Tutorial Overview," Jan. 1998, IEEE Journal of Solid–State Circuits, vol. 33, No. 1, pp. 2–17.

Barrie Gilbert, "Trnalinear Circuits,"May 1981, ECESSO course notes, University of Arizona, Orginal Publication Unknown.

An Pottbacker, U. Langmann and H. Schrieber, "A Si Bipolar Phase and Frequency Detector IC for Clock Extraction up to 8 Gb / s", Dec. 1992 IEEE Journal of Solid–State Circuits, vol. 27, No. 12.

*Primary Examiner*—Stephen Chin
*Assistant Examiner*—Michael W. Maddox
*Attorney, Agent, or Firm*—Hickman Stephens Coleman & Hughes, LLP

[57] ABSTRACT

Circuit and method for generating a signal for use in locking a second signal on a first signal. The first and second signals have an associated frequency. A first beat note signal and a second beat note signal are generated from the first and second signals, respectively, when the frequencies of the first and second signals are not equal. The circuit includes a first and second flip-flop and detector circuitry. The first flip-flop is configured to receive the first and second beat note signals for generating a first state signal. The first flip-flop generates the first state signal by sampling the second beat note signal at a first periodic interval of the first beat note signal. The second flip-flop is configured to receive the first and second beat note signals for generating a second state signal. The second flip-flop generates the second state signal by sampling the second beat note signal at a second periodic interval of the first beat note signal. The detector circuitry is coupled to receive the first and second state signals from the first and second flip-flops for detecting a polarity of the frequency difference between the first and second signals. The polarity of the frequency difference is defined in a tri-state having a positive state, a negative state, and a zero state.

36 Claims, 7 Drawing Sheets

LOCK-IN AID FREQUENCY DETECTOR

FIELD OF THE INVENTION

The present claimed invention relates to the field of frequency detector circuits. More particularly, the present claimed invention relates to lock-in aid frequency detector circuits.

BACKGROUND ART

In data communication and synchronization applications, a clock signal synchronizes and regulates the processing of data signal. For data processing, the clock signal is typically extracted from an incoming digital (e.g., binary) data signal in a digital signal format such as non-return-to-zero (NRZ) format. These applications generally use a phase-locked loop (PLL) system to recover the clock signal from the arriving digital data signal.

Conventional PLLs are typically implemented in integrated circuit systems by using low Q oscillators to reduce cost. However, since low Q oscillators are highly sensitive to variations in temperature and/or process, a variation in temperature and/or process can cause a variation in the frequency of the oscillators. Due to the frequency variation, the conventional PLLs may not lock on to the incoming digital signal properly. Thus, recovery of a clock signal from the incoming signal becomes more difficult. To overcome such frequency variation, PLL systems require a larger pull-in (i.e., capture) range, which is the range of frequencies over which the PLL systems can acquire lock with the incoming data signal.

In addition, noise signals are often generated and detected during the transmission and reception of an incoming signal. In conventional PLL systems with low Q oscillators, the pull-in range of a conventional PLL system is not significantly larger than the noise bandwidth. When a filter is used to filter out the noise, the filter further reduces the pull-in range. The inadequate pull-in range has thus presented a significant problem in recovering a clock signal from the incoming data signal.

To address the clock recovery problem, circuit designers have used an acquisition device such as a frequency detector to assist in locking on an incoming signal by increasing the lock-in range. For example, Ansgar Pottbacker and Ulrich Langmann describe a phase and frequency detector IC that implement a clock recovery scheme in an article entitled "A Si Bipolar Phase and Frequency Detector IC for Clock Extraction up to 8 Gb/s," which is incorporated herein by reference in its entirety.

Prior Art FIG. 1 illustrates a conventional PLL system 100 that employs a phase and frequency detector as described in the Pottbacker article. The PLL system 100 includes an phase detector 102, a quadrature phase detector 104, a frequency detector 106, a summer 108, a filter 110, and a voltage-controlled oscillator (VCO) 112. The phase detector 102 and the quadrature phase detector 104 receive an identical NRZ input data signal.

The VCO generates a VCO signal. The phase detector 102 receives the VCO signal while the quadrature phase detector 104 receives the VCO signal that has been delayed between 45 and 135 degrees in phase. The phase detector 102 and the quadrature phase detector sample the VCO signal and the delayed VCO signal, respectively, at every transition of the input data signal. If the frequencies of the VCO and the input data signal are unequal, the phase detectors 102 and 104 generate well known beat note signals Q1 and Q2, repectively.

The frequency detector 106 receives the beat note signals Q1 and Q2 for processing. The frequency detector 106 generates a frequency difference signal Q3 as its output. The summer 108 receives and sums the beat note signal Q1 and the frequency difference signal Q3. The filter 110 receives the summed signal and generates a DC component that drives the VCO 112 toward lock.

Unfortunately, the PLL system 100 may not lock properly to the input data signal. For example, when the beat note signal Q1 and the difference signal Q3 are not equal and opposite amplitude to cancel each other out, the PLL system may not properly drive the VCO frequency toward lock. In addition, the operation of the frequency detector 16 is relatively slow compared to the phase detectors 102 and 104. This may lead to a 180 degrees out-of phase locking of the PLL system 100 to the input data signal, which in turn lead to loss of the input data.

A PLL system addressing these problems is disclosed in U.S. Pat. No. 5,694,088 by Andrew Dickson entitled "Phase Locked Loop with Improved Phase-frequency Detection," which is incorporated herein by reference in its entirety. The PLL system by Dickson generates a squelch signal to squelch appropriate half cycles of the beat note signal Q1. A filter integrates the squelch signal to drive the VCO in the proper direction toward lock. However, this PLL system can be costly to implement due to the extra hardware associated with the generation and use of the squelch signal.

Furthermore, the conventional frequency detector may not generate an unambiguous difference signal Q3. In particular, the conventional frequency detector generally allows the PLL system 100 to lock on only one clock edge. For example, if the quadrature phase detector 104 generates "1" as the beat note signal Q2, then the frequency detector 106 will output "0" as Q3. In contrast, if the quadrature phase detector outputs "1" as Q2, the frequency detector 106 outputs -Q1, which is the inverted output signal Q1 of the phase detector 102. When the inverted output signal of the phase detector 102 becomes larger than the original phase detector signal, then the polarity of the control loop circuit changes. Accordingly, the PLL system is stable on only one clock edge. This often leads to the PLL system 100 locking on the wrong edge of the clock. In addition, the conventional frequency detector and the PLL system described in in U.S. Pat. No. 5,694,088 by Andrew Dickson generates digital signal that has to be added with the phase detector output signal Q1 to get the proper offset.

Thus, what is needed is a frequency detector that can reliably and unambiguously detect and generate a frequency difference signal without the complexity of conventional frequency detector circuits. In addition, what is needed is a frequency detector that can avoid locking on the wrong clock edge while providing a DC offset signal at its output.

SUMMARY OF THE INVENTION

Broadly speaking, the present invention fills these needs by providing a lock-in aid circuit that generates an unambiguous lock-in state. It should be appreciated that the present invention can be implemented in numerous ways, including as a process, an apparatus, a system, a device, or a method. Several inventive embodiments of the present invention are described below.

In one embodiment, the present invention provides a lock-in aid circuit for generating a signal for use in locking a second signal on a first signal. The first and second signals have an associated frequency. A first beat note signal and a second beat note signal are generated from the first and second signals, respectively, when the frequencies of the first and second signals are not equal. The circuit includes a first and second flip-flop and detector circuitry. The first flip-flop is configured to receive the first and second beat note signals for generating a first state signal. The first flip-flop generates the first state signal by sampling the second beat note signal at a first periodic interval of the first beat note signal. The second flip-flop is configured to receive the first and second beat note signals for generating a second state signal. The second flip-flop generates the second state signal by sampling the second beat note signal at a second periodic interval of the first beat note signal. The detector circuitry is coupled to receive the first and second state signals from the first and second flip-flops for detecting a polarity of the frequency difference between the first and second signals. The polarity of the frequency difference is defined in a tri-state having a positive state, a negative state, and a zero state.

In another embodiment, the present invention provides a method for generating a lock-in aid signal. The method includes: (a) receiving a first signal and a second signal, each of the first and second signal having a frequency; (b) developing a first beat note signal and a second beat note signal from the first and second signals when the frequencies of the first and second signals are not equal; (c) sampling the second beat note at a first periodic interval of the first beat note signal to generate a first state signal; (d) sampling the second beat note at a second periodic interval of the first beat note signal to generate a second state signal; (e) determining a polarity signal indicating the polarity of the frequency difference between the first and second signals in response to an inverse state of the first state signal, wherein the polarity of the frequency difference is defined as a tri-state having a positive state, a negative state, and a zero state; and (f) generating a lock signal in response to the first and second state signals when the second signal is locked on the first signal.

In yet another embodiment, a lock-in aid circuit for generating a signal for use in locking a second signal on a first signal is disclosed. Each of the first and second signals has an associated frequency. A first beat note signal and a second beat note signal are generated from the first and second signals, respectively, when the frequencies of the first and second signals are not equal. The circuit includes first state generating means, second state generating means, and detecting means. The first state generating means generates a first state signal in response to the first and second beat note signals by sampling the second beat note signal at a first periodic interval of the first beat note signal. The second state generating means generates a second state signal in response to the first and second beat note signals by sampling the second beat note signal at a second periodic interval of the first beat note signal. The detecting means detects a polarity of the frequency difference between the first and second signals in response to the first and second state signals. The polarity of the frequency difference is defined in a tri-state having a positive state, a negative state, and a zero state.

Advantageously, the present invention provides a lock-in aid circuit that can reliably detect and generate the polarity and lock signals. By using the lock signal, the present invention provides increased lock-in range for a given signal. In addition, the circuit of the present invention can be used in low current applications and is simple and cost effective to implement in an integrated circuit chip. Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

DESCRIPTION OF THE PREFERRED EMBODIMENTS

In the following detailed description of the present invention providing a lock-in aid frequency detector, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

Figure 1:
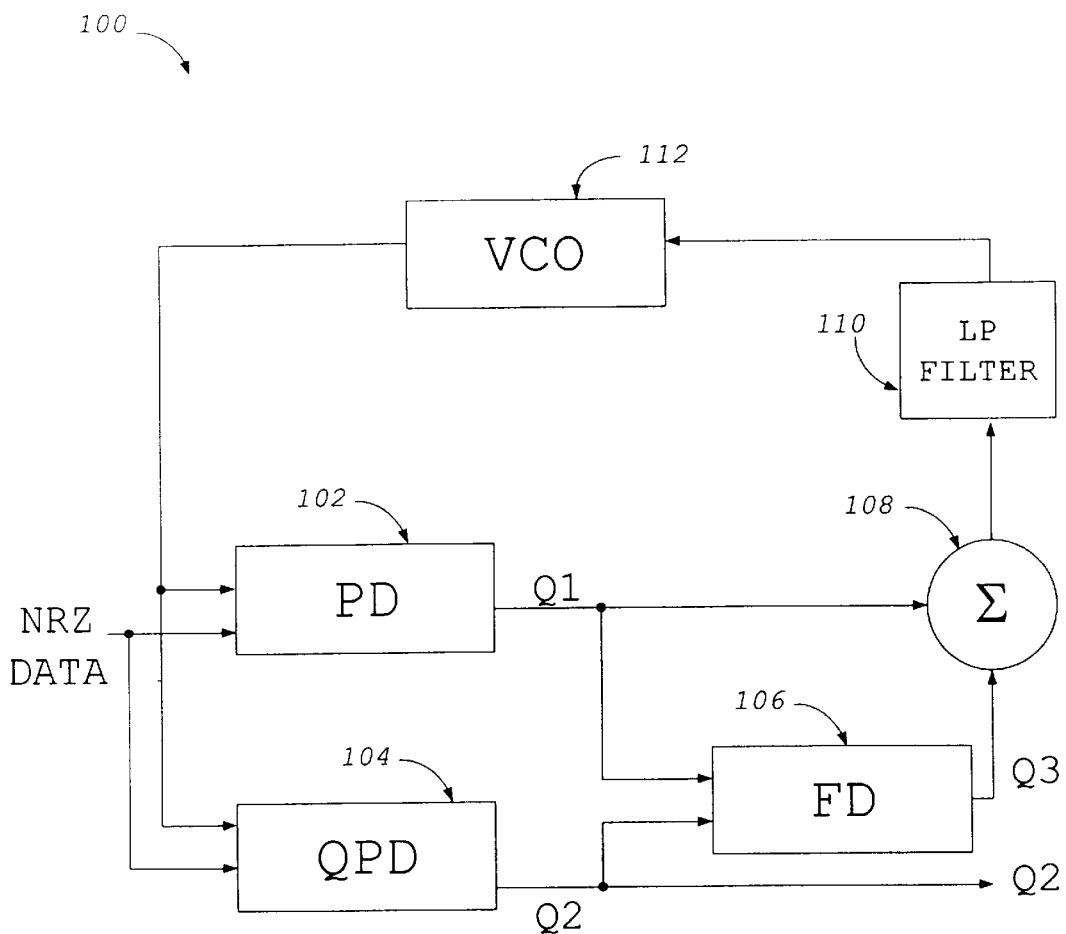
FIG. 1 illustrates a conventional PLL system that employs a phase and frequency detector.
Figure 2:
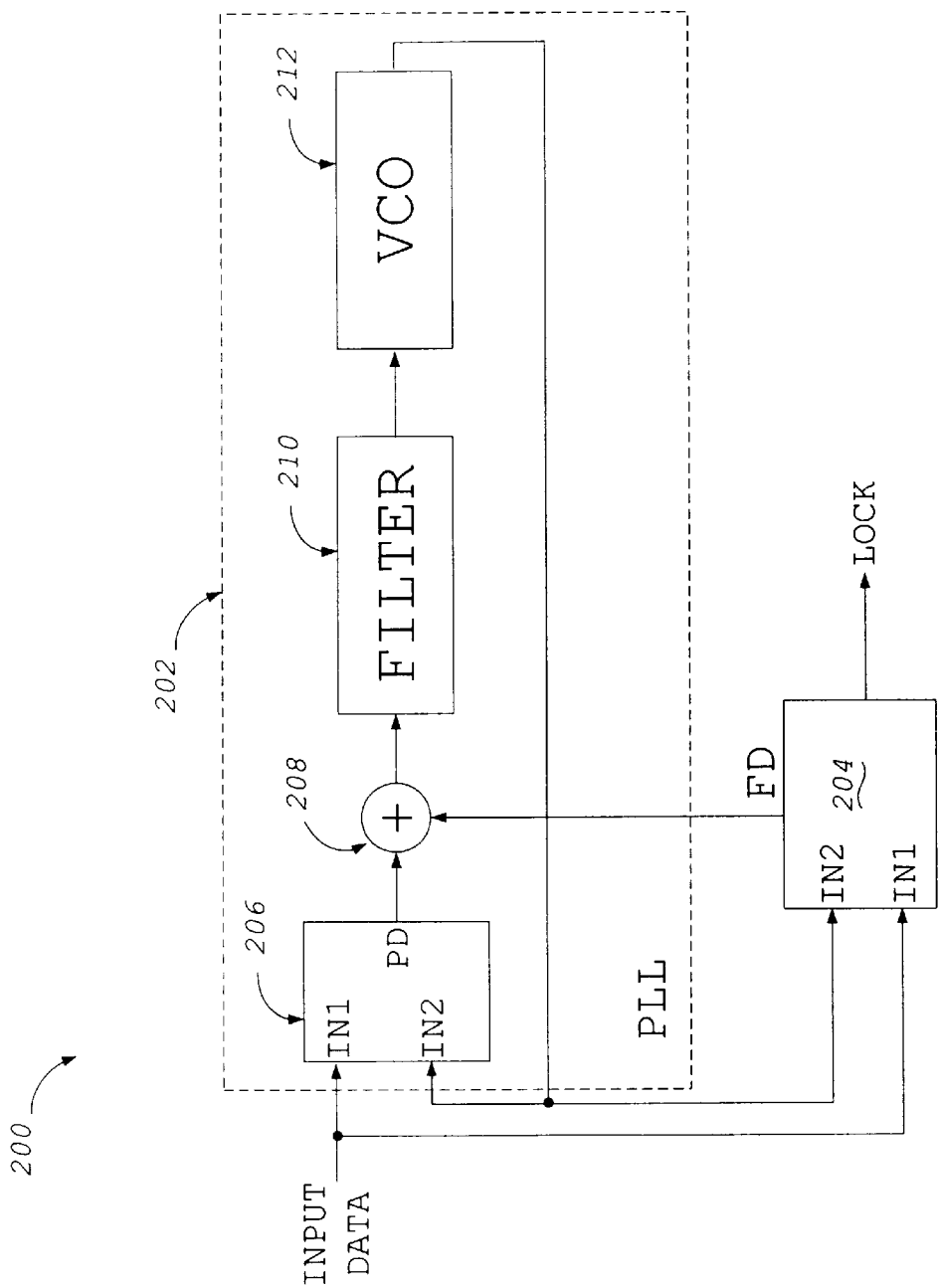
FIG. 2 illustrates a schematic diagram of a PLL system in accordance with one embodiment of the present invention.

FIG. 2 illustrates a schematic diagram of a PLL system 200 in accordance with one embodiment of the present invention. The PLL system 200 includes a PLL 202 and a phase and frequency detector 204. The PLL 202 includes a phase detector 206, a summer 208, a filter 210, and a VCO 212. The phase detector 206 and the phase and frequency detector 204 each receives input data at the respective input port IN1. Preferably, the input data is in NRZ data format. In addition, the phase detector 206 and the phase and frequency detector 204 each receives a VCO signal at respective input port IN2 from the VCO 212.

As will be shown in more detail below, the phase and frequency detector 204 generates a frequency difference from the frequency difference dependent DC-offset signal at an output port FD and a lock signal at an output port LOCK. The lock signal indicates whether the PLL is locked. The frequency difference signal represents the detected polarity of the frequency difference between the two input signals. Preferably, the frequency difference signal is a tri-state signal having a positive, negative, or zero state depending on the frequency difference between the input signals. The generated frequency difference signal is input into the summer 208.

The phase detector 206 samples the VCO signal with reference to the input data signal to generate a beat note signal at its output port PD. The summer 208 is coupled to the phase detector 206 and the phase and frequency detector 204 to receive the beat note signal and the difference signal, respectively. The summer 208 performs superposition operation of the two received signals and generates an output signal representing the sum of the two signals. Those skilled in the art will appreciate the phase detector 206 may be any phase detector that can handle NRZ data signals.

The filter 210 is coupled to receive the output signal from the summer 208 and filters the signal for output. Preferably, the filter 210 is a low pass filter designed to function as an integrator. The filtered signal is then provided to the VCO 212 as a control signal. The VCO 212 is coupled to the filter 210 to receive the filtered signal to generate the VCO signal in response to the control signal.

Figure 3:
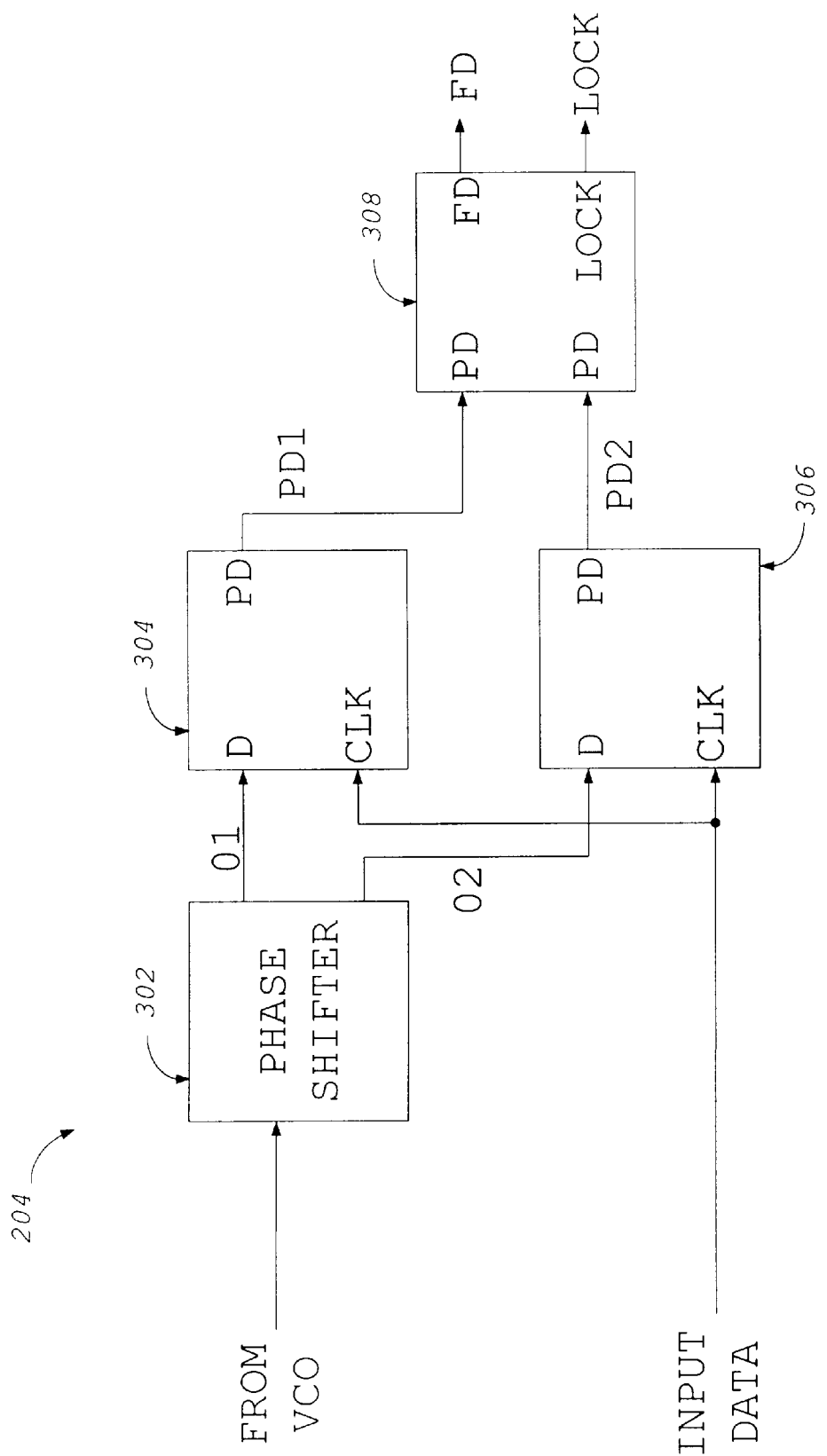
FIG. 3 shows a detailed schematic diagram of a phase and frequency detector in accordance with one embodiment of the present invention.

FIG. 3 shows a more detailed schematic diagram of the phase and frequency detector 204 in accordance with one embodiment of the present invention. The phase and frequency detector 204 includes a phase shifter 302, a pair of phase detectors 304 and 306, and a frequency detector 308. The phase shifter 302 receives a signal having a frequency (e.g., VCO signal from VCO 212) at its input port IN and outputs a pair of signals: an output signal O1, which is the original signal received by the phase shifter 302 and an output signal O2, which is a delayed version of the original signal. The phase shifter 302 generates the delayed signal O2 by shifting the phase of the original signal. Preferably, the phase detector 302 shifts the signal by 90 degrees. The 90-degree phase provides the maximum phase difference between the two signals. Even though such a delay is used herein, it should be appreciated that the present invention may implement any suitable delay between the two signals.

The pair of phase detectors 304 and 306 are each coupled to the phase shifter 302 to receive the signals O1 and O2, respectively. Each of the phase detectors 304 and 306 also receives the input data signal (e.g., NRZ data), which is used as a reference clock signal in both detectors. Specifically, the phase detectors 304 and 306 use the input data signal as a reference clock signal to sample the signals O1 and O2 at a periodic interval to generate a pair of beat note signals PD1 and PD2, respectively. The frequency detector 308 is coupled to the phase detectors 304 and 306 to receive the beat note signals PD1 and PD2. From these beat note signals, the frequency detector 308 generates the frequency difference signal and the lock signal.

Figure 4A:
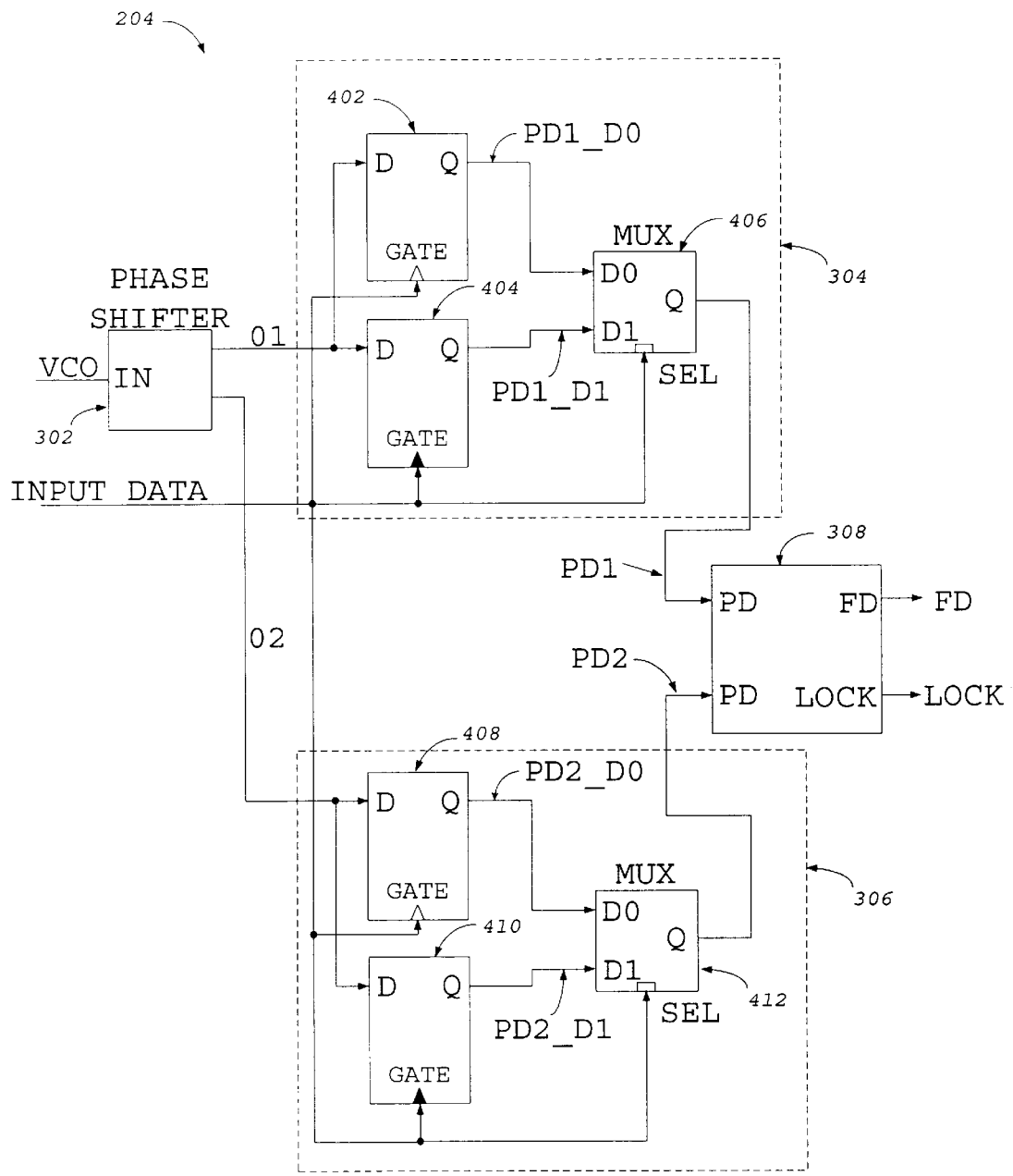
FIG. 4A shows a detailed diagram of phase detectors in the phase and frequency detector in accordance with one embodiment of the present invention.

FIG. 4A shows a more detailed diagram of the phase detectors 304 and 306 of the phase and frequency detector 204 in accordance with one embodiment of the present invention. The phase detector 304 includes a pair of latches 402 and 404, and a multiplexer 406. Likewise, the phase detector 306 includes a pair of latches 408 and 410, and a multiplexer 412. In the preferred embodiment, the latches are D-latches, which output an input signal at a D input port only upon active state of a clock.

The phase detectors 304 and 306 are used to generate digital beat note signals PD1 and PD2. For example, the latches 402 and 404 of the phase detector 304 receive the undelayed signal O1 (e.g., VCO signal) from the phase shifter 302 at respective input port D. The latches 402 and 404 also receive the input data signal for use as a clock signal.

In operation, the latches 402 and 404 are active at different times. Preferably, the latch 402 is a high active latch while the latch 404 a low active latch. Alternatively, the latch 402 may be low active while the latch 404 is high active. The latches 402 and 404 sample the signal O1 at the respective input port D when an active transition of the clock signal (i.e., input data signal) occurs. The latches 402 and 404 output the sampled input data at respective output port Q as PD1_D0 and PD1_D1, respectively.

The multiplexer 406 is coupled to the latches 402 and 404 to receive the outputs PD1_D0 and PD1_D1 at its input ports D0 and D1, respectively. The multiplexer 406 also receives the input data signal (e.g., NRZ data), which is used to select a signal at the input ports D0 and D1 for output at the output port Q as output signal PD1. Since the latches 402 and 404 are active high and active low, respectively, the multiplexer 406 outputs a beat note signal PD1 when the frequencies of the input data signal and the signal O1 are not equal.

Similarly, the phase detector 306 generates the other beat note signal PD2 using the delayed VCO signal. The latches 408 and 410 receive the delayed signal O2 (e.g., delayed VCO signal) from the phase shifter 302 at respective input port D. The latches 402 and 404 also receive the input data signal for use as a clock signal. The latches 408 and 410 are also active at different times. Preferably, the latch 408 is a high active latch while the latch 410 a low active latch. Alternatively, the latch 408 may be low active while the latch 410 is high active. The latches 408 and 410 sample the signal O2 at the respective input port D when an active transition of the clock signal (i.e., input data signal) occurs. The latches 408 and 410 output the sampled input data at respective output port Q as PD2_D0 and PD2_D1, respectively.

The multiplexer 412 is coupled to the latches 408 and 410 to receive the outputs PD2_D0 and PD2_D1 at its input ports D0 and D1, respectively. The multiplexer 412 also receives the input data signal (e.g., NRZ data), which is used to select a signal at the input ports D0 and D1 for output at the output port Q as output signal PD2. Since the latches 408 and 410 are active high and active low, respectively, the multiplexer 412 outputs a beat note PD2 when the frequencies of the input data signal and the signal O1 are not equal in phase or in amplitude. On the other hand, when the frequencies of the O1 and the input data signals are equal, the multiplexer 412 outputs a beat note PD2.

Figure 4B:
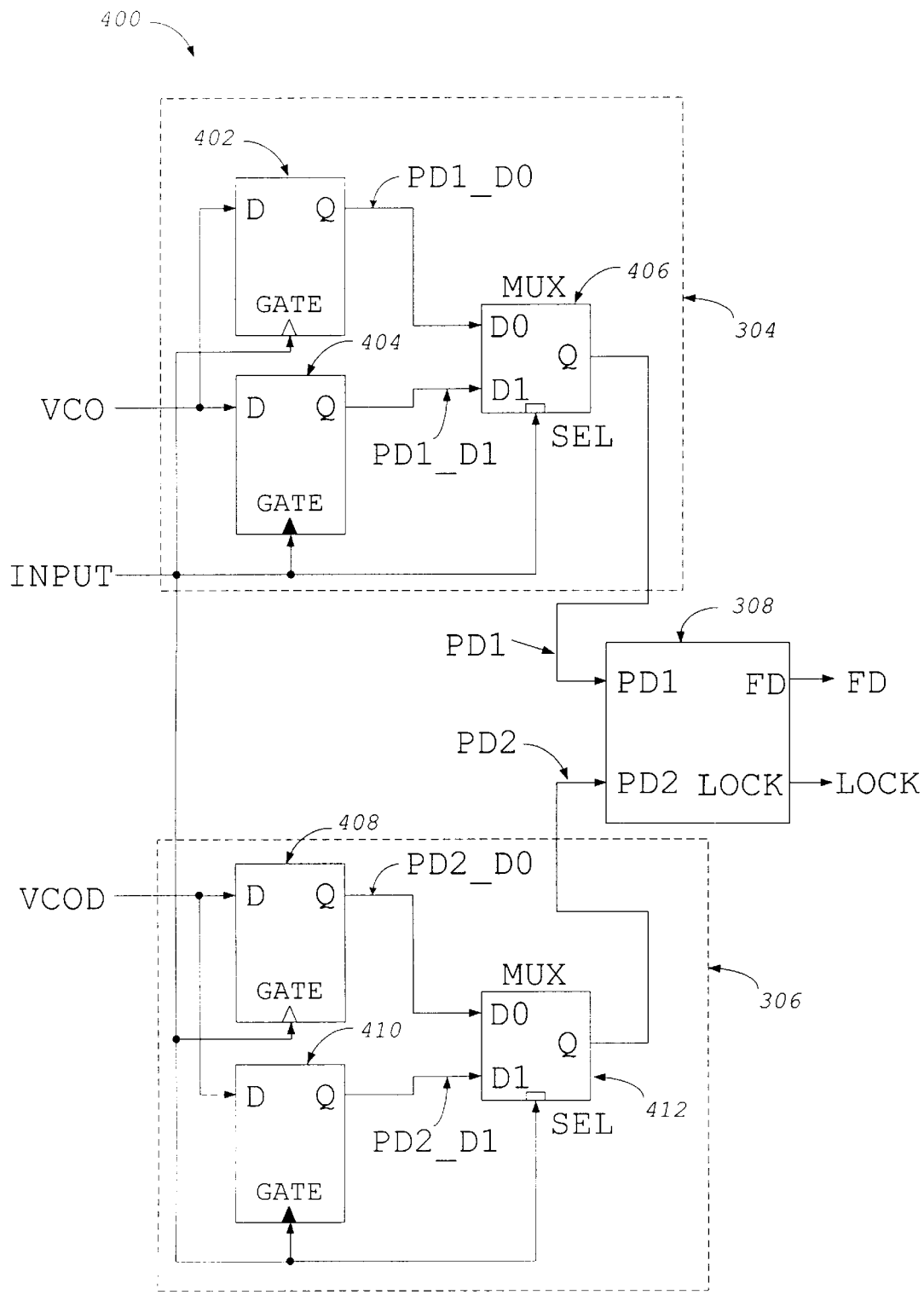
FIG. 4B illustrates a phase and frequency detector in accordance with another embodiment of the present invention.

In an alternative embodiment, the phase and frequency detector 204 may be implemented without the phase shifter 302. Instead, the phase and frequency detector 204 may receive two signals: a signal without delay (e.g., VCO signal) and a signal with a delay (e.g., delayed VCO signal). FIG. 4B illustrates the phase and frequency detector 400 in accordance with the alternative embodiment of the present invention. The phase and frequency detector 400 is identical to the phase and frequency detector 204 with the exception of two VCO signals (VCO and VCOD) instead of a single VCO signal that is illustrated in FIG. 4A. In this configuration, the VCOD signal is a delayed version of the VCO signal.

Figure 5A:
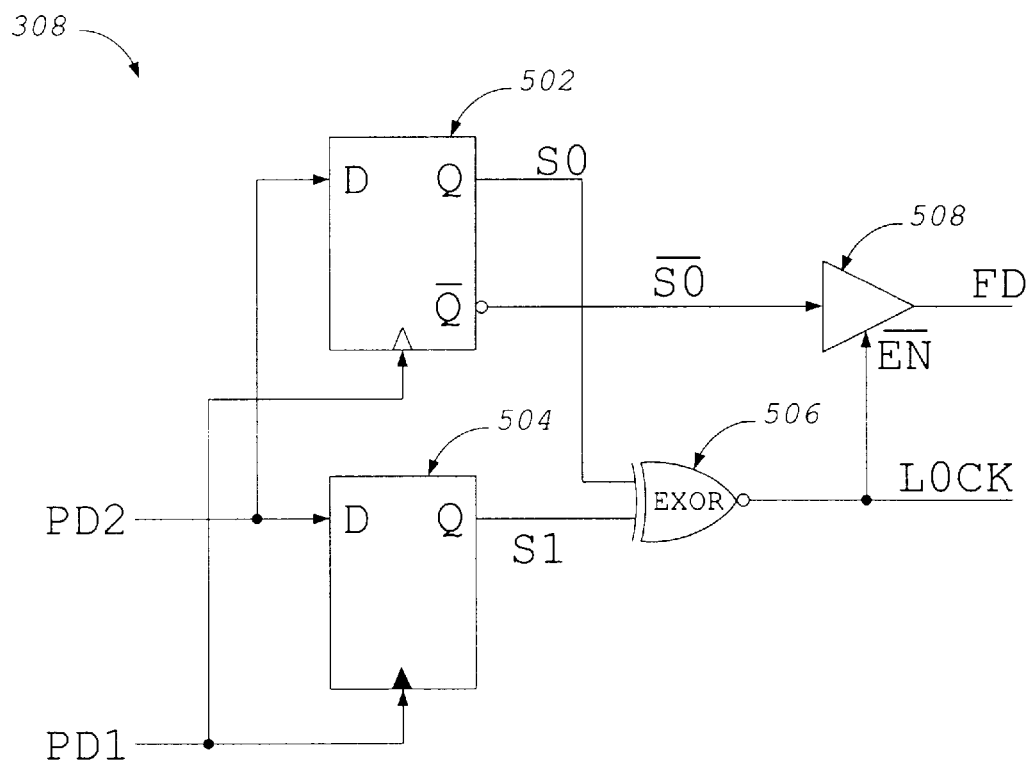
FIG. 5A shows a schematic diagram of the frequency detector 308 in accordance with one embodiment of the present invention.

FIG. 5A shows a schematic diagram of the frequency detector 308 in accordance with one embodiment of the present invention. The frequency detector 308 includes a pair of flip-flops 502 and 504, an EXNOR gate 506, and a buffer 508. In the preferred embodiment, the flip-flops 502 and 504 are D flip-flops and the buffer 508 is a tri-state buffer. Although the present invention employs such flip-flops and buffer, it may also utilize other suitable flip-flops and buffers to implement the functions of these devices.

The flip-flops 502 and 504 receive the beat note signal PD2 at respective D input port. The flip-flops 502 and 504 also receive the beat note signal PD1 at respective input clock port. The flip-flops 502 and 504 are triggered active at different edges of the clock signal. Preferably, the flip-flop 502 is triggered active at positive edges of the clock signal while the flip-flop 504 is triggered active at negative edges of the clock signal. Alternatively, the flip-flop 502 may be triggered active at negative edges while the flip-flop 504 is triggered active at positive edges of the clock signal.

The flip-flop 502 outputs a state S0 and feeds S0 to the EXNOR gate 506 as an input. The tri-state buffer 508 is coupled to the flip-flop 502 to receive an inverted state S0 and generates the frequency difference signal FD. On the other hand, the flip-flop 504 outputs a state S1 and feed S1 to the EXNOR gate 506 as another input. The EXNOR gate performs EXNOR operation on the input states S0 and S1 and generates a lock signal as an output. The lock signal is then fed to the tri-state buffer 508 to disable the tri-state buffer 508 when lock signal indicates that the frequency of the VCO signal has been locked on the input data signal. That is, if the states S0 and S1 are the same, the EXNOR gate 506 generates a lock signal indicating that lock is established. The lock signal is then used to disable the tri-state buffer 508. In addition, the lock signal may be provided to other circuits or the PLL system 200 for use as a control signal.

The tri-state of the buffer 508 include three states representing the polarity of the frequency difference between the VCO signal and input data signal: positive, negative, and zero. The state of the inverse Q, which is the input to the buffer 508, provides the positive and negative states of the FD signal. The positive and negative FD signals are used to drive the VCO signal in a proper direction to bring the VCO signal into lock with the input data signal. The lock signal, when asserted by the EXNOR gate 506, disables the buffer 508 to provide the zero state. In the zero state, the VCO is not driven in either direction.

Figure 5B:
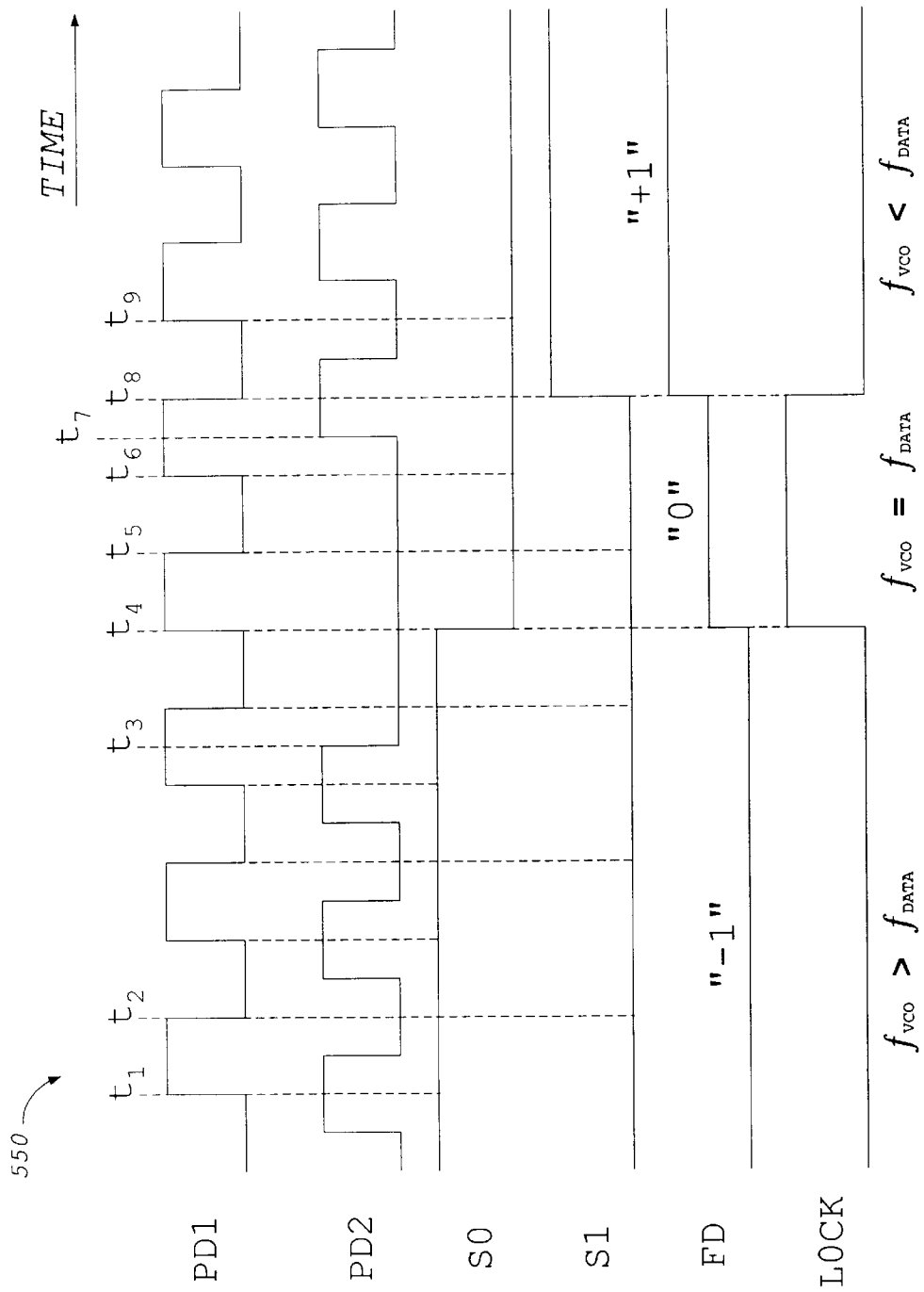
FIG. 5B illustrates a timing diagram of the frequency detector in accordance with one embodiment of the present invention.

FIG. 5B illustrates a timing diagram 550 of the frequency detector 308 in accordance with one embodiment of the present invention. The digital beat note signals PD1 and PD2 are the input signals to the frequency detector 308. The flip-flops 502 and 504 use the beat note signal PD1 as a clock signal to sample the beat note signal PD2 for output as output states S0 and S1, respectively. At every rising edge of the beat note signal PD1, the flip-flop 502 samples the beat note signal PD2 at its input port D and outputs the sampled signal at its output port Q as state S0. For example, the state S0 corresponds to the state of the beat node signal PD2 at times t1, t4, t6, and t9. Conversely, at every falling edge of the beat note signal PD1, the flip-flop 504 samples the beat note signal PD2 at its input port D and outputs the sampled signal at its output port Q as state S1. For instance, the state S1 corresponds to the state of the beat note signal PD2 at times t2, t5, and t8.

When the frequency of the VCO signal is greater than the input data frequency, the state S0 is high and the state S1 is low. For example, from time t1 to t4, the state S0 remains high while the state S1 remains low. The FD signal merely takes on the inverse state of the state S0, which is low during this period. On the other hand, the lock signal, which is generated via a EXNOR operation, remains low because the states S0 and S1 are different.

When the frequencies of the VCO and input data signals are equal, the beat note signal PD2 is low as indicated between times t3 and t7. At time t4, the flip-flop 502 samples the low state of PD2 and thus changes the S0 state to low. In contrast, the state S1 at the output Q of the flip-flop 504 remains low until time t8 because PD2 remains low at the falling edges of the clock signal PD1 until t8. Since the states of S0 and S1 are the same, the EXNOR gate generates a high lock signal. The asserted lock signal is then used to disable the buffer 508, thereby producing the "zero" state. When the buffer 508 is disabled, the buffer 508 does not transmit an FD signal.

The state of the frequency detector 308 remains in the lock state until the frequencies of the VCO and input signals become unequal. When the VCO frequency becomes greater than input data frequency, the frequency detector operates as described above for times t1 through t4. On the other hand, when the VCO frequency becomes smaller than the input data signal frequency as shown after time t8, the state S0 remains low because the beat note signal PD2 is low at every rising edge of the clock signal. The state S1, however, changes from low to high since PD2 is high at every falling edge of the clock signal from time t8. Hence, the EXNOR gate 506 outputs a low lock signal, thereby deasserting the lock signal. The deasserted lock signal reactivates the buffer 508. The buffer 508, in turn, outputs low FD signal, which is the inverse state of the high S0 state.

The present invention thus described can reliably detect and generate the polarity of the frequency difference and lock signals thereby avoiding locking on a wrong clock edge. By using the lock signal, the present invention provides increased lock-in range for a given signal. Furthermore the present invention provides a DC offset signal at its output for universal application in PLL systems independent of the type of phase detectors used therein. In addition, the circuit of the present invention can be used in low current applications and is simple and cost effective to implement in an integrated circuit chip.

While the present invention has been described in terms of several preferred embodiments, there are alterations, permutations, and equivalents which fall within the scope of this invention. It should also be noted that there are alternative ways of implementing both the method and apparatus of the present invention. It is therefore intended that the following appended claims be interpreted as including all such alterations, permutations, and equivalents as fall within the true spirit and scope of the present invention.

What is claimed is:

1. A lock-in aid circuit for generating a signal for use in locking a second signal on a first signal, each of the first and second signals having an associated frequency, a first beat note signal and a second beat note signal being generated from the first and second signals, respectively, when the frequencies of the first and second signals are not equal, the circuit comprising:

a first flip-flop configured to receive the first and second beat note signals for generating a first state signal, the first flip-flop generating the first state signal by sampling the second beat note signal at a first periodic interval of the first beat note signal;

a second flip-flop configured to receive the first and second beat note signals for generating a second state signal, the second flip-flop generating the second state signal by sampling the second beat note signal at a second periodic interval of the first beat note signal; and detector circuitry coupled to receive the first and second state signals from the first and second flip-flops for detecting a polarity of the frequency difference between the first and second signals, the polarity of the frequency difference being defined in a tri-state having a positive state, a negative state, and a zero state.

2. The circuit as recited in claim 1, wherein the first flip-flop generates an inverse of the first state signal and wherein the detector circuitry further includes:

an EXNOR gate coupled to receive the first and second state signals from the first and second flip-flops to generate a lock signal, the lock signal indicating whether the first signal is locked on the second signal; and a buffer coupled to receive the lock signal and the inverse of the first state signal for detecting the polarity of the frequency difference, the buffer generating a polarity signal indicating the detected polarity of the frequency difference.

3. The circuit as recited in claim 2, wherein the lock signal disables the buffer so as to output the zero state.

4. The circuit as recited in claim 1, wherein first flip-flop samples the second beat note signal at a rising edge of the first beat note signal and the second flip-flop samples the second beat note signal at a failing edge of the first beat note signal.

5. The circuit as recited in claim 1, wherein the first and second flip-flops are D flip-flops.

6. The circuit as recited in claim 2, wherein the buffer is a tri-state buffer.

7. The circuit as recited in claim 1, wherein the first signal is an input data signal and the second signal is a VCO signal.

8. The circuit as recited in claim 1, wherein the detected polarity is provided to a phase-locked loop to drive a VCO.

9. The circuit as recited in claim 7, wherein the input data signal is in an NRZ data format.

10. The circuit as recited in claim 1, wherein the first beat note signal is generated from the second signal and the second beat note is generated from a delayed second signal.

11. The circuit as recited in claim 10, wherein the delayed second signal is delayed between 45 and 135 degrees in phase.

12. The circuit as recited in claim 11, further comprising:

a first phase detector configured to receive the first and second signals for generating the first beat note signal; and a second phase detector configured to receive the first signal and the delayed second signal for generating the second beat note signal.

13. The circuit as recited in claim 12, further comprising:

a phase shifter configured to receive the second signal for generating the delayed second signal.

14. A method for generating a lock-in aid signal, comprising:

receiving a first signal and a second signal, each of the first and second signal having a frequency;

developing a first beat note signal and a second beat note signal from the first and second signals when the frequencies of the first and second signals are not equal;

sampling the second beat note at a first periodic interval of the first beat note signal to generate a first state signal;

sampling the second beat note at a second periodic interval of the first beat note signal to generate a second state signal;

determining a polarity signal indicating the polarity of the frequency difference between the first and second signals in response to an inverse state of the first state signal, the polarity of the frequency difference being defined as a tri-state having a positive state, a negative state, and a zero state; and generating a lock signal in response to the first and second state signals when the second signal is locked on the first signal.

15. The method as recited in claim 14, further comprising:

when the lock signal is generated, disabling the polarity signal so as to generate the polarity of zero state.

16. The method as recited in claim 14, wherein the first periodic interval corresponds to every rising edge of the first beat note signal and the second periodic interval corresponds to every falling edge of the first beat note signal.

17. The method as recited in claim 14, wherein the first signal is an input data signal and the second signal is a VCO signal.

18. The method as recited in claim 17, wherein the input data signal is an NRZ data signal and the VCO signal is from a phase-locked loop, wherein the method further comprises:

providing the polarity of the frequency difference to the phase-locked loop to bring the second signal toward lock with the first signal when the polarity signal is not disabled.

19. The method as recited in claim 18, wherein the first and second beat notes are generated by a phase detector.

20. The method as recited in claim 18, wherein the first and second state signals are generated by a first and second flip-flops, respectively.

21. The method as recited in claim 14, wherein the polarity is the inverse state of the first state signal when the second signal is not locked on the first signal.

22. The method as recited in claim 15, wherein the polarity signal is generated by a buffer.

23. The method as recited in claim 22, wherein the generated lock signal disables the buffer when the second signal is locked on the first signal.

24. The method as recited in claim 14, wherein the first beat note signal is generated from the second signal and the second beat note is generated from a delayed second signal.

25. The method as recited in claim 24, wherein the delayed second signal is delayed between 90 and 135 degrees in phase.

26. A lock-in aid circuit for generating a signal for use in locking a second signal on a first signal, each of the first and second signals having an associated frequency, a first beat note signal and a second beat note signal being generated from the first and second signals, respectively, when the frequencies of the first and second signals are not equal, the circuit comprising:

first state generating means for generating a first state signal in response to the first and second beat note signals by sampling the second beat note signal at a first periodic interval of the first beat note signal;

second state generating means for generating a second state signal in response to the first and second beat note signals by sampling the second beat note signal at a second periodic interval of the first beat note signal; and detecting means for detecting a polarity of the frequency difference between the first and second signals in response to the first and second state signals, the polarity of the frequency difference being defined in a tri-state having a positive state, a negative state, and a zero state.

27. The circuit as recited in claim 26, wherein the detector circuitry further includes:

lock signal generating means for generating a lock signal in response to the first and second state signals, the lock signal indicating whether the first signal is locked on the second signal; and buffer means for outputting a polarity in response to the lock signal and to an inverse of the first state signal, the polarity signal indicating the detected polarity of the frequency difference.

28. The circuit as recited in claim 27, wherein the lock signal disables the buffer means so as to output the zero state.

29. The circuit as recited in claim 26, wherein first state generating means samples the second beat note signal at a rising edge of the first beat note signal and the second state generating means samples the second beat note signal at a falling edge of the first beat note signal.

30. The circuit as recited in claim 26, wherein the first signal is an input data signal and the second signal is a VCO signal.

31. The circuit as recited in claim 26, wherein the detected polarity is provided to a phase-locked loop to drive a VCO.

32. The circuit as recited in claim 30, wherein the input data signal is in an NRZ data formnat.

33. The circuit as recited in claim 26, wherein the first beat note signal is generated from the second signal and the second beat note is generated from a delayed second signal.

34. The circuit as recited in claim 33, wherein the delayed second signal is delayed between 45 and 135 degrees in phase.

35. The circuit as recited in claim 26, further comprising:
a first phase detector configured to receive the first and second signals for generating the first beat note signal; and
a second phase detector configured to receive the first signal and the delayed second signal for generating the second beat note signal.

36. The circuit as recited in claim 35, further comprising:
a phase shifter configured to receive the second signal for generating the delayed second signal.

* * * * *

UNITED STATES PATENT AND TRADEMARK OFFICE
CERTIFICATE OF CORRECTION

PATENT NO. : 6,081,572  
DATED : June 27, 2000  
INVENTOR(S) : Jan Filip

Page 1 of 1

It is certified that error appears in the above-identified patent and that said Letters Patent is hereby corrected as shown below:

Title page,  
Item [73] reads: Maxim Integrated Products, Sunnyvale, Calif.";  
should read: -- Item [73] Assignees:  
    Maxim Integrated Products,  
    Sunnyvale, Calif.  
    hiSys GmbH,  
    Hannover, Germany --;

OTHER PUBLICATIONS:  
"Barrie Gilbert, "Trnalinear Circuits,"May 1891, ECESSO" it should read:  
-- Barrie Gilbert, "Translinear Circuits," May 1891, ECESSO --;

Column 9,  
Line 19 reads: "second beat note signal at a failing edge of the first beat note" it should read: -- second beat note signal at a falling edge of the first beat note --;

Column 11,  
Line 1 reads: "data signal is in an NRZ data formnat" it should read -- data signal is in an NRZ data format --

Signed and Sealed this

Seventh Day of May, 2002

Attest:

*Attesting Officer*

JAMES E. ROGAN  
*Director of the United States Patent and Trademark Office*